United States Patent [19]

Nishida et al.

[11] Patent Number: 4,589,918

[45] Date of Patent: May 20, 1986

[54] THERMAL SHOCK RESISTANT THERMOELECTRIC MATERIAL

[75] Inventors: Isao Nishida, Chiba; Katashi Masumoto, Tokyo, both of Japan

[73] Assignee: National Research Institute for Metals, Tokyo, Japan

[21] Appl. No.: 594,895

[22] Filed: Mar. 28, 1984

[51] Int. Cl.$^4$ .................. C22C 29/14; H01L 35/00
[52] U.S. Cl. ................. 75/244; 252/62.3 T; 252/519; 428/913; 428/929; 29/573; 136/239
[58] Field of Search ............ 428/929, 913; 75/123 A, 75/123 AA, 123 B, 123 D, 123 L, 230, 244; 252/62.3 T, 519; 29/573; 136/239

[56] References Cited

U.S. PATENT DOCUMENTS 3,870,568 3/1975 Oesterhelt et al. .................. 136/237
4,500,742 2/1985 Morimoto et al. ................... 136/239

FOREIGN PATENT DOCUMENTS 1021756 3/1966 United Kingdom ................ 136/239
1118184 6/1968 United Kingdom ................ 136/239

OTHER PUBLICATIONS

Andrews et al., "The Sintering of Thermoelectric Devices Based on Iron Disilicide", Proceedings of the British Ceramic Society, Electrical and Magnetic Ceramics (2), Warwick, Staffs., England.

Primary Examiner—John F. Terapane
Assistant Examiner—Anne Brookes
Attorney, Agent, or Firm—Wenderoth, Lind & Ponack

[57] ABSTRACT

A thermoelectric material comprising an alloy, a solid solution or an alloy and a solid solution consisting essentially of
(a) iron disilicide,
(b) 0.3 to 4.6 atomic %, based on the total amount of the whole component elements, of boron and optionally,
(c) 0.1 to 5.0 atomic %, based on the total amount of the whole component elements, of one element or more selected from the group of zinc, cadmium and mercury of Group IIB, aluminum, gallium, indium and thallium of Group IIIB, phosphorus, arsenic, antimony and bismuth of Group VB, sulfur, selenium and tellurium of Group VIB, chromium, molybdenum and tungsten of Group VIA, manganese, technetium and rhenium of Group VIIA and cobalt, nickel, rhodium, palladium, iridium and platinum of Group VIII in the periodic table of elements.

15 Claims, No Drawings

THERMAL SHOCK RESISTANT THERMOELECTRIC MATERIAL

BACKGROUND OF THE INVENTION

1. Field of the Invention

The present invention relates to a thermal shock resistant thermoelectric material. More particulary, it relates to a thermoelectric material comprising an alloy, a solid solution or an alloy and a solid solution consisting essentially of iron disilicide and a small amount of boron. Further, it also relates to a thermoelectric material comprising an alloy, a solid solution or an alloy and a solid solution consisting essentially of iron disilicide, a small amount of boron and a small amount of one element or more selected from the group consisting of elements of Groups IIB, IIIB, VB, VIA, VIB, VIIA and VIII in the periodic table of elements.

The thermoelectric material is used as a constituent member of a thermoelectric generator element (thermocouples) for direct conversion of heat into electricity.

The thermoelectric generator element for direct conversion of heat into electricity is basically made up of high temperature junctions and low temperature junctions, and legs of p-type thermoelectric material (semiconductor) and legs of n-type thermoelectric material (semiconductor).

The high temperature junction of the thermoelectric generator element can generally be made up by joining the leg end of the p-type thermoelectric material and the leg end of the n-type thermoelectric material with a metal plate. The high temperature junction may also be constructed as a p-n junction obtained by directly joining the leg ends of the p-type thermoelectric material and n-type thermoelectric material in order not to cause a lowering of thermal shock resistance of the thermoelectric materials. On the other hand, the low temperature junctions have lead wires connected to the respective leg ends of the p-type thermoelectric material and n-type thermoelectric material.

When the high temperature junctions, such as p-n junctions, are heated by a heat source, such as city gas flame or petroleum flame, or heated by contact with a high temperature substance, a temperature gradient occurs between the high temperature junctions and the low temperature junctions and thermoelectromotive force can be taken out from lead wires connected to the respective thermoelectric material leg ends of the low temperature junctions.

The thermoelectric generator element having the thermoelectromotive force (thermo. e.m.f.) can be utilized for compact power sources for safety valves of various gas apparatuses, or pairs of the thermoelectric generator elements may be combined to use for power sources for cordless hot air heaters using gas or petroleum as heat sources. This thermoelectric generator element can also be use as a sensor of temperature.

2. Description of Prior Art

The thermoelectric material should desirably be high in thermoelectromotive force obtained at the same time as being stabilized in air at high temperature and oxidation resistant.

Transition metal silicides are generally stabilized at high temperatures and are high temperature oxidation resistant. Because of this, they can be used as thermoelectric materials in air at high temperatures. Of these transition metal silicides, iron disilicide is stabilized at high temperatures and is high temperature oxidation resistant. It can be used in air even at 900° C. Moreover it is also high in thermoelectromotive force. This thermoelectromotive force is as high as 10–50 times that of metal thermocouples, such as platinum-platinum rhodium thermocouples, chromel-alumel thermocouples, copper-constantan thermocouples and so on. Iron disilicide, however, was unsatisfactory in thermal shock resistance and entailed the disadvantage, for instance, that it was broken at one time when quenched in water, after being heated at one end at 900° C.

Because of this, when cooling materials (such as water, oil and so on), such as water drops, become attached to the high temperature junctions of the thermoelectric generator element in the case of using a thermoelectric generator element containing iron disilicide as the constituent member at high temperatures, the high temperature junctions will break due to thermal shock.

Some doped iron disulfides are known. However, improving the thermal shock resistance of iron disilicide by addition of doping materials was heretofore unknown.

Thermoelectric materials obtained by doping iron disilicide with 2 to 5 weight % of cobalt or aluminum are known (P. M. Ware and D. J. McNeill, PROC. IEE, Vol. III, No. 1, January 1964, pp 178–182). The thermoelectric materials disclosed in this treatise contain no boron and are not thermally shock resistant.

A p-type thermoelectric element is known which is obtained by incorporating 0.03 to 0.25 mol%, based on iron disilicide, of transition metals excepting transition metals of Group VIII in the periodic table of elements (Japanese Patent No. 930733). No mention at all, however, is made in the instant patent of thermoelectric materials comprising boron-containing iron disilicide.

Further, a thermoelectric material comprising iron disilicide doped with manganese or cobalt is also known (I. Nishida, Phys. Rev. B, Vol. 7. No. 6, pp (2710–1713 (1973)). This thermoelectric material, however, contains no boron. Nor is it thermally shock resistant.

The above three references each disclose the addition of the doping material to iron disilicide, but none of them discloses the addition of boron or marked improvement of thermal shock resistance by the addition of boron.

SUMMARY OF THE INVENTION

The present invention is designed to provide a thermoelectric material with high thermoelectromotive force provided not only with heat resistance and high temperature oxidation resistance but also with thermal shock resistance.

The purpose of the present invention as the above can be achieved by a thermoelectric material comprising an alloy, a solid solution or an alloy and a solid solution consisting essentially of
  (a) iron disilicide and
  (b) 0.3 to 4.6 atomic %, based on the total amount of the whole component elements, of boron.

Further, the said purpose of the present invention can also be achieved by a thermoelectric material comprising an alloy, a solid solution or an alloy and a solid solution consisting essentially of
  (a) iron disilicide,
  (b) 0.3 to 4.6 atomic %, based on the total amount of the whole component elements, of boron and
  (c) 0.1 to 5.0 atomic %, based on the total amount of the whole component elements, of one element or more selected from the group of zinc, cadmium and mercury of Group IIB, aluminum, gallium, indium and thallium of Group IIIB, phosphorus, arsenic, antimony and bismuth of Group VB, sulfur, selenium and tellurium of Group VIB, chromium, molybdenum and tungsten of Group VIA, manganese, technetium and rhenium of Group VIIA and cobalt, nickel, rhodium, palladium, iridium and platinum of Group VIII in the periodic table of elements.

DETAILED DESCRIPTION OF THE PREFERRED EMBODIMENTS

Surpringly enough, it was found that thermal shock resistance of iron disilicide could be markedly improved by addition of a small amount of boron to iron disilicide.

It was also found that iron disilicide could be markedly improved in thermal shock resistance by addition of small amounts of boron and doping material to iron disilicide without substantially causing a lowering of its thermoelectromotive force.

The present invention was achieved on the basis of the above findings.

The thermoelectric material according to the present invention comprises an alloy, a solid solution or mixture of an alloy and a solid solution consisting essentially of
(a) iron disulfide and
(b) 0.3 to 4.6 atomic %, based on the total amount of the whole component element, of boron.

The term "consisting essentially of components (a) and (b)" used in the instant specification implies that the alloy and solid solution for thermoelectric material according to the present invention may contain small amounts of impurities other than components (a) and (b).

The amount of boron contained in the alloy, solid solution or alloy admixture with said solid solution for the thermoelectric material of the present invention is 0.3–4.6 atomic %, preferably 0.6–3.6 atomic %, and more preferably 1.3–2.5 atomic %, based on the total amount of the whole component elements. When the boron content falls within this range, the thermoelectric material is provided not only with heat resistance and high temperature oxidation resistance, but also with thermal shock resistance. When the boron content is less than 0.3 atomic %, the thermoelectric material mainly comprising iron disilicide does not show sufficient thermal shock resistance. On the other hand, when the boron content is in excess of 4.6 atomic %, thermal shock resistance of the thermoelectric material will be lowered.

Iron and metallic silicon used in the production of iron disilicide as the principal components of the thermoelectric material according to the present invention may be commercially available 99% or more purity iron and commercially available 98% or more purity metallic silicon. It is, of course, possible to use more high purity iron and/or metallic silicon for the production of the said iron disulfide, but in the present invention it is not necessary to use such high purity iron or metallic silicon and 99% or more and 98% or more will suffice for the purities of iron and metallic silicon, respectively.

Boron used in the production of the thermoelectric material according to the present invention may be either commercially available amorphous boron or crystal boron. Crystal boron is preferred.

The thermoelectric material according to the present invention also comprises an alloy, a solid solution or an alloy and a solid solution consisting essentially of
(a) iron disilicide,
(b) 0.3 to 4.6 atomic %, based on the total amount of the whole component element, of boron and
(c) 0.1 to 5.0 atomic %, based on the total amount of the whole component elements, of one element or more selected from the group of zinc, cadmium and mercury of Group IIB, aluminum, gallium, indium and thallium, of Group IIIB, phosphorus, arsenic, antimony and bismuth of Group VB, sulfur, selenium and tellurium of Group VIB, chromium, molybdenum and tungsten of Group VIA, manganese, technetium and rhenium of Group VIIA and cobalt, nickel, rhodium, palladium, iridium and platinum of Group VIII in the periodic table of elements.

The term "consisting essentially of components (a), (b) and (c)" used in the instant specification implies that small amounts of impurities other than components (a), (b) and (c) may be contained.

In the present invention it is possible to use, as the doping material, 0.1 to 5.0 atomic %, based on the total amount of the whole component elements, of one element or more selected from the group of zinc, cadmium and mercury of Group IIB, aluminum, gallium, indium and thallium of Group IIIB, phosphorus, arsenic, antimony and bismuth of Group VB, sulfur, selenium and tellurium of Group VIB, chromium, molybdenum and tungsten of Group VIA, manganese, technetium and rhenium of Group VIIA and cobalt, nickel, rhodium, palladium, iridium and platinum of Group VIII in the periodic table of elements.

It is preferred to use, as the doping material, 0.1 to 5.0 atomic %, based on the total amount of the whole component elements, of one element or more selected from the group of zinc and cadmium of Group IIB, aluminum and gallium of Group IIIB, arsenic, antimony and bismuth of Group VB, selenium and tellurium of Group VIB, chromium and molybdenum of Group VIA, manganese and rhenium of Group VIIA and cobalt, nickel, rhodium and palladium of Group VIII in the periodic table of elements.

It is more preferred to use, as the doping material, 0.1 to 5.0 atomic %, based on the total amount of the whole component elements, of one element or more selected from the group of zinc of Group IIB, aluminum of Group IIIB, antimony of Group VB, selenium of Group VIB, chromium of Group VIA, manganese of Group VIIA and cobalt and nickel of Group VIII in the periodic table of elements.

In one embodiment of the present invention there is used, as the doping material, 0.1 to 5.0 atomic %, based on the total amount of the whole component elements, of one element or more selected from the group of zinc, cadmium and mercury of Group IIB, aluminum, gallium, indium and thallium of Group IIIB, chromium, molybdenum and tungsten of Group VIA and manganese, technetium and rhenium of Group VIIA in the periodic table of elements. When one or more of these doping materials are added to boron-containing iron disilicide, a superior p-type thermoelectric material is obtained.

In another embodiment of the present invention there is used, as the doping material, 0.1 to 5.0 atomic %, based on the total amount of the whole component elements, of one element or more selected from the group of phosphorus, arsenic, antimony and bismuth of Group VB, sulfur, selenium and tellurium of Group VIB and cobalt, nickel, rhodium, palladium, iridium and platinum of Group VIII in the periodic table of elements. A superior n-type thermoelectric material can be obtained by addition of one or more of these doping materials to boron-containing iron disilicide.

The amount of the doping material used in the present invention usually falls in the range of 0.1 to 5.0 atomic % based on the total amount of the whole component elements, but it may also fall in the range of 0.01 to 10.0 atomic % as the case may be. The amount of the doping material used should preferably fall in the range of 0.5 to 3.3 atomic %.

Commercially available low purity ones may be used said elements as the doping material used in the present invention. Needless to say, more high purity ones are also be usable.

Next, the process for production of the thermoelectric material of the present invention will be explained.

In one embodiment of the process for production of the thermoelectric material of the present invention use is made of iron, such as commercially available 99% or more purity iron, and metallic silicon, such as commercially available 98% or more purity metallic silicon. The purity of iron and/or of metallic silicon may be lower than the said purity unless their impurities adversely affect the properties, such as thermal shock resistance, of the thermoelectric material of the present invention. The purity of iron and/or of metallic silicon may, of course, be higher than the said purity, but in the present invention the said purities of commercially available iron and metallic silicon will suffice.

Iron and metallic silicon are placed in a furnace, such as a high frequency induction furnace, and melted by heating in a an inert atmosphere, such as in vacuum, preferably in vacuum at $10^{-4}$ or more, at a high temperature, such as 1500° to 1800° C., preferably 1550° to 1700° C. and more preferably 1570° to 1630° C., to make a molten mass at 1500° to 1800° C., preferably 1550° to 1700° C., and more preferably 1570° to 1630° C.

Amounts of iron and metallic silicon used, in an atomic ratio, should be 1:1.9 to 2.1, preferably 1:1.95 to 2.05 and more preferably 1:1.98 to 2.02.

Iron disilicide not containing boron is prepared by lowering the temperature of the said molten mass to 1350° to 1480° C., preferably 1370° to 1450° C. and more preferably 1380° to 1420° C., and then casting the molten mass in a metallic die and cooling the mass. Natural cooling will suffice for cooling.

On the other hand, iron disilicide containing boron and/or doping material, viz., one element or more selected from the group of zinc, cadmium and mercury of Group IIB, aluminum, gallium, indium and thallium of Group IIIB, phosphorus, arsenic, antimony and bismuth of Group VB, sulfur, selenium and tellurium of Group VIB, chromium, molybdenum and tungsten of Group VIA, manganese, technetium and rhenium of Group VIIA and cobalt, nickel, rhodium, palladium, iridium and platinum of Group VIII in the periodic table of elements, can be prepared by adding a given amount of boron and/or a given amount of doping material to the molten mass while the temperature of the molten mass is held at 1500° to 1800° C., preferably 1550° to 1700° C., and more preferably 1570° to 1630° C., then lowering the temperature of the molten mass to 1350° to 1480° C., preferably 1370° to 1450° C., and more preferably 1380° to 1420° C., and then casting the molten mass in the metallic die and cooling the mass.

The doping material being volatile at relatively low temperatures, such as aluminum, may be added just before the molten mass is cast in the metallic die.

In the above explanation, iron disilicide is first prepared from iron and metallic silicon and then boron and/or doping material is added to iron disilicide, but the order of adding iron, metallic silicon and boron and/or doping material is optional and for instance, boron and/or doping material may be added to iron and then iron disilicide containing boron and/or doping material may be made from iron containing boron and/or doping material and metallic silicon. As another method, boron and/or doping material may first be added to metallic silicon. Further, boron and doping material may be added simultaneously or separately. Doping material may be added as an iron compound, such as ferromanganese and ferroaluminum.

The amount of boron added as the above is such an amount as to contain 0.3 to 4.6 atomic %, preferably 0.6 to 3.6 atomic % and more preferably 1.3 to 2.5 atomic %, based on the total amount of the whole component elements, of boron in the boron-containing iron disilicide. The boron-containing iron disilicide referred to here may or may not contain the doping material.

The amount of the doping material added as the above is such an amount as to contain 0.005 to 10.0 atomic %, preferably 0.1 to 5.0 atomic %, and more preferably 0.5 to 3.3 atomic %, based on the total amount of the whole component elements, of doping material in the doping material-containing iron disilicide.

Iron disilicide obtained above is crushed to a powder 0.1 to 50 μm, preferably 0.3 to 25 μm, and more preferably 0.5 to 15 μm, in average particle diameter.

Crushing may be effected in the usual crushing known in the art, such as stamping mill, ball mill and so on.

Crushing may be effected in two stages or more. For instance, iron disilicide as cast which was obtained as the above is first crushed in a crusher, such as stamping mill, to a powder 0.1 mm to 5.0 mm, preferably 0.2 mm to 2.0 mm, and more preferably 0.1 mm to 1.0 mm, in average particle diameter and then crushed in a ball mill to a powder 0.1 to 50 μm, preferably 0.3 to 25 μm, and more preferably 0.5 to 15 μm, in average particle diameter.

The powder formed is stirred by addition of a given amount of a liquid, such as water, alcohol and so on, and a given amount of a binder, such as polyvinyl alcohol (PVA), colloidal paraffin, camphor and so on, to make a slurry mixture(slip). The amount of the liquid added is an appropriate amount sufficient for the preparation of the slurry mixture, and usually it is 150–300 g of the liquid per kg of the powder. The amount of the binder added is 5–50 g.

The slip formed is adjusted for the liquid content. In the case, for instance, of using water, it is heated at 60° to 100° C. by means of a heater, such as a mantel heater, until the water content reaches 10–12%.

The slip with the liquid content adjusted is held in a sealed vessel for 1 to 100 hours, preferably 10–50 hours.

Then the slip is pressed at a pressure of 100–1000 kg/cm², preferably 500–900 kg/cm², to a prepressed compact body. The prepressed compact body so pressed is dried until the content of the liquid component reaches 5 to 10%. As another method the slip may be cast in a plaster die and solidified by drying to give a powder compact body at normal pressure.

The prepressed or powder compact body obtained is crushed in a mortar, for instance, to a powder about 0.01 to 5.0 mm, preferably 0.05 to 1.0 mm, and more preferably 0.1 to 0.5 mm, in average particle diameter, and the powder formed is pressed into a pressed compact body at a pressure of 0.5 to 10 tons/cm², preferably 1 to 5 tons/cm², and more preferably 1.5 to 3 tons/cm².

The pressed compact body (green compact) so obtained is sintered at a temperature of 1050° to 1250° C., preferably 1100° to 1200° C., and more preferably 1140° to 1170° C., for 0.5 to 20 hours, preferably 1 to 10 hours, and more preferably 2 to 5 hours. The optimum sintering temperature depends on the amount of boron added and particle diameter of the powder used when preparing the pressed compact body. The optimum sintering temperature becomes lower with the increase in the amount of boron added as well as with the decrease in particle diameter of the powder.

The pressed compact body so sintered is then annealed at a temperature of 650° to 900° C., preferably 700° to 850° C., and more preferably 750° to 830° C., for 10 to 1000 hours, preferably 30 to 500 hours, and more preferably 50 to 200 hours, to give a sintered material. This annealing can be effected either in air or in vacuum. Annealing in air is preferred. A sintered product with a given size, such as 5 mm×10 mm×30 mm, conveniently used as the thermoelectric material can be made of the sintered material so obtained.

In the instant specification the said sintered product 5 mm×10 mm×30 mm is used as a sintered specimen to test the thermoelectric properties, viz., thermoelectromotive force and thermal shock resistance, of the sintered product.

EXAMPLE 1

Preparation of thermoelectric material 1,994 kg of commercially available 99% or more purity iron chips and 2,006 kg of commercially available metallic silicon masses were weighed, placed in a high frequency induced furnace with a melting capacity of 10 kg and melted by heating at 1600° C. in a vacuum of about $10^{-5}$ Torr to make a molten mass at 1600° C. Then the temperature of the molten mass formed was lowered to 1400° C. and then it was cast in a metallic die to produce iron disilicide not containing boron. On the other hand, a given amount of crystal boron was added to the molten mass at 1600° C. obtained as the above, then the temperature of the boron-containing molten mass so formed was lowered to 1400° C. and then the molten mass was cast in the metallic die to produce iron disilicide containing a given amount boron. The amount of boron added above was such an amount as to reach 0.30, 0.67, 1.30, 1.90, 2.47, 3.57, 4.60 and 5.57 atomic %, respectively, based on the total amount of the whole component elements, in the boron content of the boron-containing iron disilicide formed.

Iron disilicide as cast which was obtained as the above was first crushed in a stamping mill to a powder about 0.5 mm in particle diameter and then crushed in a ball mill to a powder 0.5 to 15 µm in particle diameter.

One (1) kg of the powder so obtained was weighed and stirred by addition of 200 g of water and 10 g of polyvinyl alcohol (PVA) to give a slurry mixture (slip). The slip formed was dried by heating at 70°-90° C. by means of a mantel heater with stirring until the water content of the slip reached 10-12%. After that this slip was placed in a sealed vessel in such a manner that water was no longer evaporated and held at room temperature for 20 to 24 hours. Then the slip was pressed into a prepressed compact body at a pressure of 800 kg/cm² and this prepressed compact body was dried until the water content reached 7-9%. The dried prepressed compact body obtained was crushed in a mortar to a powder about 0.3 mm in average particle diameter and the powder formed was pressed to a pressed compact body at a pressure of 2 tons/cm².

The pressed compact body was sintered at a temperature of 1140° to 1170° C. for 3 hours and then annealed at a temperature of 800° C. for 100 hours to give a sintered material. A sintered specimen 5 mm×10 mm×30 mm was made of the sintered material so obtained. This sintered specimen was used to measure thermoelectromotive force and to test thermal shock resistance.

Measurement of thermoelectromotive force

One end of the sintered specimen (thermoelectric material) was heated by covering with a platinum heater and the temperature of that end was held at 800° C. On the other hand, the other end of the sintered specimen was held at 50° C. by soldering to a heat sink cooled with water.

The thermoelectromotive force generated between one end held at 800° C. and the other end held at 50° C. was measured by means of a digital voltmeter. The value of thermoelectromotive force was given as a minus symbol when the potential of one end (low temperature end) soldered to the cooled sink was negative and as a plus symbol when it was positive.

Test of thermal shock resistance

A partial heating test and homogeneous heating test were used for the testing of thermal shock resistance.

(i) Partial heating test

A sintered specimen (thermoelectric material) with one end heated at 900° C. by a compact heater and the other end not heated was quenched in water at about 20° C. The thermoelectric material which was not broken when quenched in water was once again heated in one end alone at 900° C. as the above and then quenched in water at about 20° C. Such a heat and quench cycle was repeated for the respective thermoelectric materials to investigate quenching times until the thermoelectric material was broken.

(ii) Homogeneous heating test

The homogeneous heating test was conducted by homogeneously heating the sintered specimen (thermoelectric material) at 900° C. in an electric furnace and then quenching in water at about 20° C. The specimen which was not broken when quenched in water was once again homogeneously heated at 900° C. and quenched in water at about 20° C. Such a heat and quench cycle was repeated for the respective thermoelectric materials to investigate quenching times until the thermoelectric material was broken.

Table 1 shows the measurement results of thermoelectromotive force and test results of thermal shock resistance on sintered specimens (thermoelectric materials) not containing boron and sintered specimens (thermoelectric materials) containing given amounts of boron.

TABLE 1

Effect of boron on thermoelectromotive force and thermal shock resistance of thermoelectric material of iron disilicide

| Example No. | Boron content of iron disilicide (atomic %) | Thermo. e.m.f. (mV) | Thermal shock resistance — Quenching times until breakage occurs in the case of partial heating | Thermal shock resistance — Quenching times until breakage occurs in the case of homogeneous heating |
|---|---|---|---|---|
| 1a | 0.00 | +166 | 1 ± 1[1][2] | 5 ± 3[1] |
| 1b | 0.30 | +63 | 5 ± 2[1] | 21 ± 5[1] |
| 1c | 0.67 | +41 | 20 ± 3[1] | 50 or more |
| 1d | 1.30 | −118 | 30 or more | " |
| 1e | 1.90 | −89 | " | " |
| 1f | 2.47 | −81 | " | " |
| 1g | 3.57 | −71 | 18 ± 4[1] | " |
| 1h | 4.60 | −34 | 10 ± 3[1] | " |
| 1i | 5.57 | −9 | 5 ± 3[1] | 20 ± 6[1] |

Footnote:
[1]indicates quenching times obtained in tests conducted on 10 sintered specimens.
[2]Breakage in the case of quenching times being 1 − 1 = 0 indicates that it is broken on the occasion of a first time of heating.

It follows from Table 1 that in the case where 0.30 to 5.57 atomic % of boron is contained in iron disilicide, as compared with the case where boron is not contained in iron disilicide, thermal shock resistance of thermoelectric material is markedly improved.

It is also noted from Table 1 that in the case where the boron content of iron disilicide is 1.30 to 2.47 atomic %, the thermoelectric material is superior in thermal shock resistance with high thermoelectromotive force being maintained.

Further, when iron disilicide containing 0.3 to 4.6 atomic % of boron was heated to 900° C. for 200 hours in air, the weight increase was 0.8 mg/cm² or less. This implies that the thermoelectric material of the present invention is stabilized at high temperatures and high temperature oxidation resistant.

EXAMPLE 2

Operations were conducted in like manner as in Example 1 except that in the step for the preparation of the slip 20 g of colloidal paraffin (a suspension of 10 g of paraffin and 10 g of water) was used instead of polyvinyl alcohol (PVA). The results were shown in Table 2.

TABLE 2

Effect of boron on thermoelectromotive force and thermal shock resistance of thermoelectric material of iron disilicide

| Example No. | Boron content of iron disilicide (atomic %) | Thermo. e.m.f. (mV) | Thermal shock resistance — Quenching times until breakage occurs in the case of partial heating | Thermal shock resistance — Quenching times until breakage occurs in the case of homogeneous heating |
|---|---|---|---|---|
| 2a | 0.00 | +166 | 1 ± 1[1][2] | 5 ± 3[1] |
| 2b | 0.30 | +63 | 5 ± 2[1] | 21 ± 5[1] |
| 2c | 0.67 | +41 | 20 ± 3[1] | 50 or more |
| 2d | 1.30 | −118 | 30 or more | " |
| 2e | 1.90 | −89 | " | " |
| 2f | 2.47 | −81 | " | " |
| 2g | 3.57 | −71 | 18 ± 4[1] | " |
| 2h | 4.60 | −34 | 10 ± 3[1] | " |
| 2i | 5.57 | −9 | 5 ± 3[1] | 20 ± 6[1] |

Footnote:
[1]indicates quenching times obtained in tests conducted on 10 sintered specimens.
[2]Breakage in the case of quenching times being 1 − 1 = 0 indicates that it is broken on the occasion of a first time of heating.

It is noticed from Table 2 that thermoelectric material with superior thermal shock resistance could be obtained by addition of boron even when 20 g of colloidal paraffin was used instead of 10 g of polyvinyl alcohol (PVA) as the binder in the step for the preparation of the slip in Example 1.

EXAMPLE 3

The same operations as in Example 1 were conducted except that in the step for the preparation of the slip 200 g of alcohol was used instead of 200 g of water and 10 g of camphor was used instead of 10 g of polyvinyl alcohol (PVA). The results were shown in Table 3.

TABLE 3

Effect of boron on thermoelectromotive force and thermal shock resistance of thermoelectric material of iron disilicide

| Example No. | Boron content of iron disilicide (atomic %) | Thermo. e.m.f. (mV) | Thermal shock resistance — Quenching times until breakage occurs in the case of partial heating | Thermal shock resistance — Quenching times until breakage occurs in the case of homogeneous heating |
|---|---|---|---|---|
| 3a | 0.00 | +166 | 1 ± 1[1][2] | 5 ± 3[1] |
| 3b | 0.30 | +63 | 5 ± 2[1] | 21 ± 5[1] |
| 3c | 0.67 | +41 | 20 ± 3[1] | 50 or more |
| 3d | 1.30 | −118 | 30 or more | " |
| 3e | 1.90 | −89 | " | " |
| 3f | 2.47 | −81 | " | " |
| 3g | 3.57 | −71 | 18 ± 4[1] | " |
| 3h | 4.60 | −34 | 10 ± 3[1] | " |
| 3i | 5.57 | −9 | 5 ± 3[1] | 20 ± 6[1] |

Footnote:
[1]indicates quenching times obtained in tests conducted on 10 sintered specimens.
[2]Breakage in the case of quenching times being 1 − 1 = 0 indicates that it is broken on the occasion of a first time of heating.

It is noted from Table 3 that thermoelectric material with superior thermal shock resistance could be obtained by addition of boron even when 200 g of alcohol was used instead of 200 g of water and 10 g of camphor was used instead of 10 g of polyvinyl alcohol (PVA) in the step for the preparation of the slip in Example 1.

EXAMPLE 4

The same operations as in Example 1 were repeated except that the step for the preparation of the slip and the step for the preparation of the powder compact body were carried out as mentioned hereinafter.

One (1) kg of powder 0.5 to 15 μm in particle diameter obtained by crushing in a ball mill was weighed and this powder was stirred by addition of 250 g of water and 10 g of polyvinyl alcohol (PVA) to give a well-flowable slurry mixture (slip). Then this slip was cast in a plaster die and solidified by drying to make a powder compact body at normal pressure.

The results obtained in the instant Example were shown in Table 4.

TABLE 4

Effect of boron on thermoelectromotive force and thermal shock resistance of thermoelectric material of iron disilicide

| Example No. | Boron content of iron disilicide (atomic %) | Thermo. e.m.f. (mV) | Thermal shock resistance — Quenching times until breakage occurs in the case of partial heating | Thermal shock resistance — Quenching times until breakage occurs in the case of homogeneous heating |
|---|---|---|---|---|
| 4a | 0.00 | +166 | 1 ± 1[1][2] | 5 ± 3[1] |
| 4b | 0.30 | +63 | 5 ± 2[1] | 21 ± 5[1] |
| 4c | 0.67 | +41 | 20 ± 3[1] | 50 or more |
| 4d | 1.30 | −118 | 30 or more | " |
| 4e | 1.90 | −89 | " | " |
| 4f | 2.47 | −81 | " | " |
| 4g | 3.57 | −71 | 18 ± 4[1] | " |
| 4h | 4.60 | −34 | 10 ± 3[1] | " |

TABLE 4-continued

Effect of boron on thermoelectromotive force and thermal shock resistance of thermoelectric material of iron disilicide

| Example No. | Boron content of iron disilicide (atomic %) | Thermo. e.m.f. (mV) | Thermal shock resistance | |
|---|---|---|---|---|
| | | | Quenching times until breakage occurs in the case of partial heating | Quenching times until breakage occurs in the case of homogeneous heating |
| 4i | 5.57 | −9 | 5 ± 3[1] | 20 ± 6[1] |

Footnote:
[1]indicates quenching times obtained in tests conducted on 10 sintered specimens.
[2]Breakage in the case of quenching times being 1 − 1 = 0 indicates that it is broken on the occasion of a first time of heating.

It is noted from Table 4 that thermoelectric material with superior thermal shock resistance could be obtained by addition of boron even when 1 kg of powder 0.5 to 15 μm in particle diameter obtained by crushing in a ball mill was weighed and this powder was stirred by addition of 250 g of water and 10 g of polyvinyl alcohol (PVA) to give a well-flowable slurry mixture (slip), and then this slip was cast in a plaster die and solidified by drying to make a powder compact body at normal pressure in stead of the step for the preparation of the slip and the step for the preparation of the pre-pressed compact body in Example 1.

EXAMPLE 5

Preparation of thermoelectric material 1.994 kg of commercially availably 99% or more purity iron chips and 2,006 kg of commercially available metallic silicon masses were weighed, placed in a high frequency induced furnace with a melting capacity of 10 kg and melted by heating at 1600° C. in a vacuum of about $10^{-5}$ Torr to make a molten mass at 1600° C. A given amount of crystal boron and a given amount of doping material were added to the molten mass at 1600° C. so obtained, then the temperature of the boron and doping material containing molten mass formed was lowered to 1400° C. and then the molten mass was cast in the metallic die to produce iron disilicide containing given amounts of boron and doping material. The amount of boron added above was such as to reach 0.30, 2.00 and 2.50 atomic %, respectively, based on the total amount of the whole component elements, in the boron content of the boron and doping material-containing iron disilicide formed and the amount of doping material added above was such an amount as to reach 0.5 atomic % in the chromium content, 1.5 and 3.3 atomic % in the manganese content, 1.1 and 2.0 atomic % in the aluminum content and 0.8 atomic % in the zinc content, respectively, in the boron and doping material-containing iron disilicide formed.

Iron disilicide as cast which was obtained as the above was first crushed in a stamping mill to a powder about 0.5 mm in particle diameter and then it was crushed in a ball mill to a powder 0.5 to 15 μm in particle diameter.

One (1) kg of the powder so obtained was weighed and stirred by addition of 200 g of water and 10 g of polyvinyl alcohol (PVA) to give a slurry mixture (slip). The slip formed was dried by heating at 70°-90° C. by means of a mantel heater with stirring until the water content of the slip reached 10-12%. After that this slip was placed in a sealed vessel in such a manner that water was no longer evaporated and held at room temperature for 20 to 24 hours. Then the slip was pressed into a prepressed compact body at a pressure of 800 kg/cm² and this prepressed compact body was dried until the water content reached 7-9%. The dried prepressed compact body obtained was crushed in a mortar to a powder about 0.3 mm in average particle diameter and the powder formed was pressed to a pressed compact body at a pressure of 2 tons/cm².

The pressed compact body was sintered at a temperature of 1140° to 1170° C. for 3 hours and then annealed at a temperature of 800° C. for 100 hours to give a sintered material. A sintered specimen 5 mm × 10 mm × 30 mm was made of the sintered material so obtained.

For the purpose of obtaining sintered specimens for comparison sintered specimens were prepared in like manner as mentioned above except that no boron was added.

These sintered specimens were used as thermoelectric materials to measure thermoelectromotive force and to test thermal shock resistance in like manner as in Example 1.

Table 5 shows measurement results of thermoelectromotive force and test results of thermal shock resistance on sintered specimens (thermoelectric materials) containing given amounts of boron and given amounts of doping material and sintered specimens (thermoelectric materials) containing given amounts of doping material alone but not boron.

TABLE 5

Effect of boron on thermoelectromotive force and thermal shock resistance of thermoelectric material of iron disilicide

| Example No. | Boron content of iron disilicide (atomic %) | Doping Material (atomic %) | | | | Thermo. e.m.f. (mV) | Thermal shock resistance Quenching times until breakage occurs in the case of partial heating |
|---|---|---|---|---|---|---|---|
| | | Cr | Mn | Al[3] | Zn | | |
| 5a | 0.00 | 0.5 | — | — | — | +225 | 1 ± 1[1 2] |
| 5b | 0.00 | — | 1.5 | — | — | +250 | " |
| 5c | 0.00 | — | — | 2.0 | — | +185 | " |
| 5d | 0.00 | — | — | — | 0.8 | +200 | " |
| 5e | 0.30 | 0.5 | — | — | — | +230 | 6 ± 2[2] |
| 5f | 0.30 | — | 1.5 | — | — | +250 | " |
| 5g | 0.30 | — | 3.3 | — | — | +205 | " |
| 5h | 2.00 | — | — | 2.0 | — | +120 | 30 or more |
| 5i | 2.00 | — | — | — | 0.8 | +205 | " |
| 5j | 2.50 | — | 3.3 | — | — | +228 | " |
| 5k | 2.50 | — | 1.7 | 1.1 | — | +218 | " |

Footnote:
[1]indicates quenching times obtained in tests conducted on 10 sintered specimens.
[2]Breakage in the case of quenching times being 1 − 1 = 0 indicates that it is broken on the occasion of a first time of heating.
[3]Aluminum was added to the molten mass at 1400° C. just before it was cast in the metallic die.

It follows from Table 5 that in the case where boron along with doping material is contained in iron disilicide (Examples 5e, 5f, 5g, 5h, 5i, 5j and 5k), as compared with the case where iron disilicide contains doping material alone, but not boron (Examples 5a, 5b, 5c and 5d), the thermoelectric material is by far superior in thermal shock resistance. Further, by comparing Examples 5a and 5e, Examples 5b and 5f and Examples 5d and 5i in Table 5, respectively, it is noted that thermoelectromotive force is not lowered even if boron is added to iron disilicide.

EXAMPLE 6

The same operations as in Example 5 were conducted except that in the step for the preparation of the slip 20 g of colloidal paraffin (a suspension of 10 g of paraffin and 10 g of water) was used instead of 10 g of polyvinyl alcohol (PVA). The results were shown in Table 6.

TABLE 6

Effect of boron on thermoelectromotive force and thermal shock resistance of thermoelectric material of iron disilicide

| Example No. | Boron content of iron disilicide (atomic %) | Doping material (atomic %) | | | | Thermo. e.m.f. (mV) | Thermal shock resistance Quenching times until breakage occurs in the case of partial heating |
|---|---|---|---|---|---|---|---|
| | | Cr | Mn | Al[3] | Zn | | |
| 6a | 0.00 | 0.5 | — | — | — | +225 | $1 \pm 1$[1][2] |
| 6b | 0.00 | — | 1.5 | — | — | +250 | " |
| 6c | 0.00 | — | — | 2.0 | — | +185 | " |
| 6d | 0.00 | — | — | — | 0.8 | +200 | " |
| 6e | 0.30 | 0.5 | — | — | — | +230 | $6 \pm 2$[2] |
| 6f | 0.30 | — | 1.5 | — | — | +250 | " |
| 6g | 0.30 | — | 3.3 | — | — | +205 | " |
| 6h | 2.00 | — | — | 2.0 | — | +120 | 30 or more |
| 6i | 2.00 | — | — | — | 0.8 | +205 | " |
| 6j | 2.50 | — | 3.3 | — | — | +228 | " |
| 6k | 2.50 | — | 1.7 | 1.1 | — | +218 | " |

Footnote:
[1] indicates quenching times obtained in tests conducted on 10 sintered specimens.
[2] Breakage in the case of quenching times being $1 - 1 = 0$ indicates that it is broken on the occasion of a first time of heating.
[3] Aluminum was added to the molten mass at 1400° C. just before it was cast in the metallic die.

It is noticed from Table 6 that a thermoelectric material with superior thermal shock resistance could be obtained by addition of boron even when 20 g of colloidal paraffin was used instead of 10 g of polyvinyl alcohol (PVA) as the binder in the step for the preparation of the slip in Example 2.

EXAMPLE 7

The same operations as in Example 5 were conducted except that in the step for the preparation of the slip 200 g of alcohol was used instead of 200 g of water and 10 g of camphor was used instead of 10 g of polyvinyl alcohol (PVA). The results were shown in Table 7.

TABLE 7

Effect of boron on thermoelectromotive force and thermal shock resistance of thermoelectric material of iron disilicide

| Example No. | Boron content of iron disilicide (atomic %) | Doping material (atomic %) | | | | Thermo. e.m.f. (mV) | Thermal shock resistance Quenching times until breakage occurs in the case of partial heating |
|---|---|---|---|---|---|---|---|
| | | Cr | Mn | Al[3] | Zn | | |
| 7a | 0.00 | 0.5 | — | — | — | +225 | $1 \pm 1$[1][2] |
| 7b | 0.00 | — | 1.5 | — | — | +250 | " |
| 7c | 0.00 | — | — | 2.0 | — | +185 | " |
| 7d | 0.00 | — | — | — | 0.8 | +200 | " |
| 7e | 0.30 | 0.5 | — | — | — | +230 | $6 \pm 2$[2] |
| 7f | 0.30 | — | 1.5 | — | — | +250 | " |
| 7g | 0.30 | — | 3.3 | — | — | +205 | " |
| 7h | 2.00 | — | — | 2.0 | — | +120 | 30 or more |
| 7i | 2.00 | — | — | — | 0.8 | +205 | " |
| 7j | 2.50 | — | 3.3 | — | — | +228 | " |
| 7k | 2.50 | — | 1.7 | 1.1 | — | +218 | " |

Footnote:
[1] indicates quenching times obtained in tests conducted on 10 sintered specimens.
[2] Breakage in the case of quenching times being $1 - 1 = 0$ indicates that it is broken on the occasion of a first time of heating.
[3] Aluminum was added to the molten mass at 1400° C. just before it was cast in the metallic die.

It is noted from Table 7 that thermoelectric material with superior thermal shock resistance could be obtained by addition of boron even when 200 g of alcohol was used instead of 200 g of water and 10 g of camphor was used instead of 10 g of polyvinyl alcohol (PVA) in the step for the preparation of the slip in Example 5.

EXAMPLE 8

The same operations as in Example 5 were repeated except that the step for the preparation of the slip and the step for the preparation of the powder compact body were carried out as mentioned hereinafter.

One (1) kg of powder 0.5 to 15 μm in particle diameter obtained by crushing in a ball mill was weighed and this powder was stirred by addition of 250 g of water and 10 g of polyvinyl alcohol (PVA) to give a well-flowable slurry mixture (slip). Then this slip was cast in a plaster die and solidified by drying to make a powder compact body at normal pressure.

Results obtained in the instant Example were shown in Table 8.

TABLE 8

Effect of boron on thermoelectromotive force and thermal shock resistance of thermoelectric material of iron disilicide

| Example No. | Boron content of iron disilicide (atomic %) | Doping Material (atomic %) | | | | Thermo. e.m.f. (mV) | Thermal shock Quenching times until breakage occurs in the case of partial heating |
|---|---|---|---|---|---|---|---|
| | | Cr | Mn | Al[3] | Zn | | |
| 8a | 0.00 | 0.5 | — | — | — | +225 | $1 \pm 1$[1][2] |
| 8b | 0.00 | — | 1.5 | — | — | +250 | " |
| 8c | 0.00 | — | — | 2.0 | — | +185 | " |
| 8d | 0.00 | — | — | — | 0.8 | +200 | " |
| 8e | 0.30 | 0.5 | — | — | — | +230 | $6 \pm 2$[2] |
| 8f | 0.30 | — | 1.5 | — | — | +250 | " |
| 8g | 0.30 | — | 3.3 | — | — | +205 | " |
| 8h | 2.00 | — | — | 2.0 | — | +120 | 30 or more |
| 8i | 2.00 | — | — | — | 0.8 | +205 | " |
| 8j | 2.50 | — | 3.3 | — | — | +228 | " |
| 8k | 2.50 | — | 1.7 | 1.1 | — | +218 | " |

Footnote:
[1] indicates quenching times obtained in tests conducted on 10 sintered specimens.
[2] Breakage in the case of quenching times being $1 - 1 = 0$ indicates that it is broken on the occasion of a first time of heating.
[3] Aluminum was added to the molten mass at 1400° C. just before it was cast in the metallic die.

It is noted from Table 8 that thermoelectric material with superior thermal shock resistance could be obtained by addition of boron even when 1 kg of powder 0.5 to 15 μm in particle diameter obtained by crushing in a ball mill was weighed and this powder was stirred by addition of 250 g of water and 10 g of polyvinyl alcohol (PVA) to give a well-flowable slurry mixture (slip), and then this slip was cast in a plaster die and solidified by drying to make a powder compact body at normal pressure instead of the step for the preparation of the slip and the step for the preparation of the prepressed compact body in Example 5.

EXAMPLE 9

Preparation of thermoelectric material 1,994 kg of commercially availably 99% or more purity iron chips and 2,006 kg of commercially available metallic silicon masses were weighed, placed in a high frequency induction furnace with a melting capacity of 10 kg and melted by heating at 1600° C. in a vacuum of about $10^{-5}$ Torr to make a molten mass at 1600° C. A given amount of crystal boron and a given amount of doping material were added to the molten mass at 1600° C. so obtained, then the temperature of the boron and doping material-containing molten mass formed was lowered to 1400° C. and then the molten mass was cast in the metallic die to produce iron disilicide containing a given amount of boron. The amount of boron added above was such an amount as to reach 1.30 atomic %, based on the total amount of the whole component elements, in the boron content of the boron and doping material-containing iron disilicide formed, and the amount of doping material added above was such an amount as to reach 0.5, 1.0 and 1.7 atomic % in the cobalt content, 0.8 atomic % in the nickel content, 0.5 and 0.8 atomic % in the antimony content and 0.5 atomic % in the selenium content, respectively, in the boron and doping material-containing iron disilicide formed.

Iron disilicide as cast which was obtained as the above was first crushed in a stamping mill to a powder about 0.5 mm in particle diameter and then it was crushed in a ball mill to a powder 0.5 to 15 μm in particle diameter.

One (1) kg of the powder so obtained was weighed and stirred by addition of 200 g of water and 10 g of polyvinyl alcohol (PVA) to give a slurry mixture (slip). The slip formed was dried by heating at 70°–90° C. by means of a mantel heater with stirring until the water content of the slip reached 10–12%. After that this slip was placed in a sealed vessel in such a manner that water was no longer evaporated and held at room temperature for 20 to 24 hours. Then the slip was pressed into a prepressed compact body at a pressure of 800 kg/cm$^2$ and this prepressed compact body was dried until the water content reached 7–9%. The dried prepressed compact body obtained was crushed in a mortar to a powder about 0.3 mm in average particle diameter and the powder formed was pressed to a pressed compact body at a pressure of 2 tons/cm$^2$.

The pressed compact body was sintered at a temperature of 1140° to 1170° C. for 3 hours and then at a temperature of 800° C. for 100 hours to give a sintered material. A sintered specimen 5 mm×10 mm×30 mm was made of the sintered material so obtained.

For the purpose of obtaining sintered specimens for comparison, sintered specimens were prepared in like manner as mentioned above except that no boron was added.

These sintered specimens were used as thermoelectric materials to measure thermoelectromotive force and to test thermal shock resistance in like manner as in Example 1.

Table 9 shows measurement results of thermoelectromotive force and test results of thermal shock resistance on sintered specimens (thermoelectric materials) containing given amounts of boron and given amounts of doping material and sintered specimens (thermoelectric materials) containing given amounts of doping material alone but not boron.

TABLE 9

Effect of boron on thermoelectromotive force and thermal shock resistance of thermoelectric material of iron disilicide

| Example No. | Boron content of iron disilicide (atomic %) | Doping material (atomic %) | | | | Thermo. e.m.f. (mV) | Thermal shock resistance Quenching times until breakage occurs in the case of partial heating |
|---|---|---|---|---|---|---|---|
| | | Co | Ni | Sb | Se | | |
| 9a | 0.00 | 0.5 | — | — | — | −195 | 1 ± 1[1][2] |
| 9b | 0.00 | 1.0 | — | — | — | −155 | " |
| 9c | 0.00 | — | 0.8 | — | — | −158 | " |
| 9d | 0.00 | — | — | 0.5 | — | −160 | " |
| 9e | 0.00 | — | — | — | 0.5 | −180 | " |
| 9f | 1.30 | 0.5 | — | — | — | −200 | 30 or more[1] |
| 9g | 1.30 | 1.7 | — | — | — | −148 | " |
| 9h | 1.30 | — | 0.8 | — | — | −205 | " |
| 9i | 1.30 | — | — | 0.5 | — | −150 | " |
| 9j | 1.30 | — | — | — | 0.5 | −160 | " |
| 9k | 1.30 | 1.0 | — | 0.8 | — | −130 | " |
| 9l | 1.30 | 1.0 | — | — | 0.5 | −150 | " |

Footnote:
[1]indicates quenching times obtained in tests conducted on 10 sintered specimens.
[2]Breakage in the case of quenching times being 1 − 1 = 0 indicates that it is broken on the occasion of a first time of heating.

It follows from Table 9 that in the case where boron along with doping material is contained in iron disilicide (Examples 9f, 9g, 9h, 9i, 9j, 9k and 9l), as compared with the case where iron disilicide contains doping material alone, but not boron (Examples 9a, 9b, 9c, 9d and 9e), the thermalelectric material is by far superior in thermal shock resistance. Further, by comparing Examples 9a and 9f, Examples 9c and 9h, Examples 9d and 9i and Examples 9e and 9j in Table 9, respectively, it is noted that the thermoelectromotive force is not substantially lowered even if boron is added to iron disilicide.

EXAMPLE 10

The same operations as in Example 9 were conducted except that 20 g of colloidal paraffin (a suspension of 10 g of paraffin and 10 g of water) was used instead of 10 g of polyvinyl alcohol (PVA) in the step for the preparation of the slip. The results were shown in Table 10.

TABLE 10

Effect of boron on thermoelectromotive force and thermal shock resistance of thermoelectric material of iron disilicide

| Example No. | Boron content of iron disilicide (atomic %) | Doping material (atomic %) | | | | Thermo. e.m.f. (mV) | Thermal shock resistance Quenching times until breakage occurs in the case of partial heating |
|---|---|---|---|---|---|---|---|
| | | Co | Ni | Sb | Se | | |
| 10a | 0.00 | 0.5 | — | — | — | −195 | 1 ± 1[1][2] |
| 10b | 0.00 | 1.0 | — | — | — | −155 | " |
| 10c | 0.00 | — | 0.8 | — | — | −158 | " |
| 10d | 0.00 | — | — | 0.5 | — | −160 | " |
| 10e | 0.00 | — | — | — | 0.5 | −180 | " |
| 10f | 1.30 | 0.5 | — | — | — | −200 | 30 or more[1] |
| 10g | 1.30 | 1.7 | — | — | — | −148 | " |
| 10h | 1.30 | — | 0.8 | — | — | −205 | " |
| 10i | 1.30 | — | — | 0.5 | — | −150 | " |
| 10j | 1.30 | — | — | — | 0.5 | −160 | " |
| 10k | 1.30 | 1.0 | — | 0.8 | — | −130 | " |
| 10l | 1.30 | 1.0 | — | — | 0.5 | −150 | " |

Footnote:
[1]indicates quenching times obtained in tests conducted on 10 sintered specimens.
[2]Breakage in the case of quenching times being 1 − 1 = 0 indicates that it is broken on the occasion of a first time of heating.

It is noticed from Table 10 that thermoelectric material with superior thermal shock resistance could be obtained by addition of boron even when 20 g of colloidal paraffin was used instead of 10 g of polyvinyl alcohol (PVA) as the binder in the step for the preparation of the slip in Example 9.

EXAMPLE 11

The same operations as in Example 9 were conducted except that in the step for the preparation of the slip 200 g of alcohol was used instead of 200 g of water and 10 g of camphor was used instead of 10 g of polyvinyl alcohol (PVA). The results were shown in Table 11.

TABLE 11

Effect of boron on thermoelectromotive force and thermal shock resistance of thermoelectric material of iron disilicide

| Example No. | Boron content of iron disilicide (atomic %) | Doping material (atomic %) | | | | Thermo. e.m.f. (mV) | Thermal shock resistance Quenching times until breakage occurs in the case of partial heating |
|---|---|---|---|---|---|---|---|
| | | Co | Ni | Sb | Se | | |
| 11a | 0.00 | 0.5 | — | — | — | −195 | 1 ± 1[1][2] |
| 11b | 0.00 | 1.0 | — | — | — | −155 | " |
| 11c | 0.00 | — | 0.8 | — | — | −158 | " |
| 11d | 0.00 | — | — | 0.5 | — | −160 | " |
| 11e | 0.00 | — | — | — | 0.5 | −180 | " |
| 11f | 1.30 | 0.5 | — | — | — | −200 | 30 or more[1] |
| 11g | 1.30 | 1.7 | — | — | — | −148 | " |
| 11h | 1.30 | — | 0.8 | — | — | −205 | " |
| 11i | 1.30 | — | — | 0.5 | — | −150 | " |
| 11j | 1.30 | — | — | — | 0.5 | −160 | " |
| 11k | 1.30 | 1.0 | — | 0.8 | — | −130 | " |
| 11l | 1.30 | 1.0 | — | — | 0.5 | −150 | " |

Footnote:
[1]indicates quenching times obtained in tests conducted on 10 sintered specimens.
[2]Breakage in the case of quenching times being 1 − 1 = 0 indicates that it is broken on the occasion of a first time of heating.

It is noted from Table 11 that thermoelectric material with superior thermal shock resistance could be obtained by addition of boron even when 200 g of alcohol was used instead of 200 g of water and 10 g of camphor was used instead of 10 g of polyvinyl alcohol (PVA) in the step for the preparation of the slip in Example 9.

EXAMPLE 12

The same operations as in Example 9 were repeated except that the step for the preparation of the slip and the step for the preparation of the powder compact body were carried out as mentioned hereinafter.

One (1) kg of powder 0.5 to 15 μm in particle diameter obtained by crushing in a ball mill was weighed and this powder was stirred by addition of 250 g of water and 10 g of polyvinyl alcohol (PVA) to give a readily flowable slurry mixture (slip). Then this slip was cast in a plaster die and solidified by drying to make a powder compact body at normal pressure.

Results obtained in the instant Example were shown in Table 12.

TABLE 12

Effect of boron on thermoelectromotive force and thermal shock resistance of thermoelectric material of iron disilicide

| Example No. | Boron content of iron disilicide (atomic %) | Doping material (atomic %) | | | | Thermo. e.m.f. (mV) | Thermal shock resistance Quenching times until breakage occurs in the case of partial heating |
|---|---|---|---|---|---|---|---|
| | | Co | Ni | Sb | Se | | |
| 12a | 0.00 | 0.5 | — | — | — | −195 | 1 ± 1[1][2] |
| 12b | 0.00 | 1.0 | — | — | — | −155 | " |
| 12c | 0.00 | — | 0.8 | — | — | −158 | " |
| 12d | 0.00 | — | — | 0.5 | — | −160 | " |
| 12e | 0.00 | — | — | — | 0.5 | −180 | " |
| 12f | 1.30 | 0.5 | — | — | — | −200 | 30 or more[1] |
| 12g | 1.30 | 1.7 | — | — | — | −148 | " |
| 12h | 1.30 | — | 0.8 | — | — | −205 | " |
| 12i | 1.30 | — | — | 0.5 | — | −150 | " |
| 12j | 1.30 | — | — | — | 0.5 | −160 | " |
| 12k | 1.30 | 1.0 | — | 0.8 | — | −130 | " |
| 12l | 1.30 | 1.0 | — | — | 0.5 | −150 | " |

Footnote:
[1]indicates quenching times obtained in tests conducted on 10 sintered specimens.
[2]Breakage in the case of quenching times being 1 − 1 = 0 indicates that it is broken on the occasion of a first time of heating.

It is noted from Table 12 that thermoelectric material with superior thermal shock resistance could be obtained by addition of boron even when 1 kg of powder 0.5 to 15 μm in particle diameter obtained by crushing in a ball mill was weighed and this powder was stirred by addition of 250 g of water and 10 g of polyvinyl alcohol (PVA) to give a readily flowable slurry mixture (slip), and then this slip was cast in a plaster die and solidified by drying to make a powder compact body at normal pressure instead of the slip for the preparation of the slip and the step for the preparation of the pre-pressed compact body in Example 9.

What is claimed is:

1. A thermoelectric material comprising an alloy, a solid solution or an alloy admixed with a solid solution consisting essentially of
   (a) iron disilicide and
   (b) 0.3 to 4.6 atomic %, based on the total amount of the whole component elements, of boron.

2. The thermoelectric material according to claim 1 in which the boron content is 0.6 to 3.6 atomic % based on the total amount of the whole component elements.

3. The thermoelectric material according to claim 1 in which the boron content is 1.3 to 2.5 atomic % based on the total amount of the whole component elements.

4. A thermoelectric material comprising an alloy, a solid solution or an alloy admixed with a solid solution consisting essentially of
   (a) iron disilicide,
   (b) 0.3 to 4.6 atomic %, based on the total amount of the whole component elements, of boron and
   (c) 0.1 to 5.0 atomic %, based on the total amount of the whole component elements, of one element or more selected from the group consisting of zinc, cadmium and mercury of Group IIB, aluminum, gallium, indium and thallium of Group IIIB, phosphorus, arsenic, antimony and bismuth of Group VB, sulfur, selenium and tellurium of Group VIB, chromium, molybdenum and tungsten of Group VIA, manganese, technetium and rhenium of Group VIIA and cobalt, nickel, rhodium, palladium, iridium and platinum of Group VIII in the periodic table of elements.

5. The thermoelectric material according to claim 4 in which the boron content is 0.6 to 3.6 atomic % based on the total amount of the whole component elements.

6. The thermoelectric material according to claim 4 in which the boron content is 1.3 to 2.5 atomic % based on the total amount of the whole component elements.

7. The thermoelectric material according to claim 4 in which the amount of one element or more selected from the group consisting of zinc, cadmium and mercury of Group IIB, aluminum, gallium, indium and thallium of Group IIIB, phosphorus, arsenic, antimony and bismuth of Group VB, sulfur, selenium and tellurium of Group VIB, chromium, molybdenum and tungsten of Group VIA, manganese, technetium and rhenium of Group VIIA and cobalt, nickel, rhodium, palladium, iridium and platinum of Group VIII in the peripalladium, iridium and platinum of Group VIII in the periodic table of elements, is 0.5 to 3.3 atomic % based on the total amount of the whole component elements.

8. The thermoelectric material according to claim 4 comprising an alloy, a solid solution or an alloy admixed with a solid solution consisting essentially of
   (a) iron disilicide,
   (b) 0.3 to 4.6 atomic %, based on the total amount of the whole component elements, of boron and
   (c) 0.1 to 5.0 atomic %, based on the total amount of the whole component elements, of one element or more selected from the group consisting of zinc and cadmium of Group IIB, aluminum and gallium of Group IIIB, arsenic, antimony and bismuth of Group VB, selenium and tellurium of Group VIB, chromium and molybdenum of Group VIA, manganese and rhenium of Group VIIA and cobalt, nickel, rhodium and palladium of Group VIII in the period table of elements.

9. The thermoelectric material according to claim 8 in which the boron content is 0.6 to 3.6 atomic % based on the total amount of the whole component elements.

10. The thermoelectric material according to claim 8 in which the boron content is 1.3 to 2.5 atomic % based on the total amount of the whole component elements.

11. The thermoelectric material according to claim 8 in which the amount of one element or more selected from the group consisting of zinc and cadmium of Group IIB, aluminum and gallium of Group IIIB, arsenic, antimony and bismuth of Group VB, selenium and tellurium of Group VIB, chromium and molybdenum of Group VIA, manganese and rhenium of Group VIIA and cobalt, nickel, rhodium and palladium of Group VIII in the periodic table of elements is 0.5 to 3.3 atomic % based on the total amount of the whole component elements.

12. The thermoelectric material according to claim 4 comprising an alloy, a solid solution or an alloy admixed with a solid solution consisting essentially of
   (a) iron disilicide,
   (b) 0.3 to 4.6 atomic %, based on the total amount of the whole component elements, of boron and
   (c) 0.1 to 5.0 atomic %, based on the total amount of the whole component elements, of one element or more selected from the group consisting of zinc of Group IIB, aluminum of Group IIIB, antimony of group VB, selenium of Group VIB, chromium of Group VIA, manganese of Group VIIA and cobalt and nickel of Group VIII in the periodic table of elements.

13. The thermoelectric material according to claim 12 in which the boron content is 0.6 to 3.6 atomic % based on the total amount of the whole component elements.

14. The thermoelectric material according to claim 12 in which the boron content is 1.3 to 2.5 atomic % based on the total amount of the whole component elements.

15. The thermoelectric material according to claim 12 in which the amount of one element or more selected from the group consisting of zinc of Group IIB, aluminum of Group IIIB, antimony of Group VB, selenium of Group VIB, chromium of Group VIA, manganese of Group VIIA and cobalt and nickel of Group VIII in the periodic table of elements is 0.5 to 3.3 atomic % based on the total amount of the whole component elements.

* * * * *